(12) United States Patent
Nomura et al.

(10) Patent No.: US 11,011,933 B2
(45) Date of Patent: May 18, 2021

(54) CONTACTLESS ELECTRIC POWER SUPPLY DEVICE

(71) Applicant: FUJI CORPORATION, Chiryu (JP)

(72) Inventors: Takeshi Nomura, Chiryu (JP); Shinji Takikawa, Nagoya (JP); Shinichi Kato, Anjo (JP)

(73) Assignee: FUJI CORPORATION, Chiryu (JP)

(*) Notice: Subject to any disclaimer, the term of this patent is extended or adjusted under 35 U.S.C. 154(b) by 360 days.

(21) Appl. No.: 16/087,765

(22) PCT Filed: Mar. 25, 2016

(86) PCT No.: PCT/JP2016/059529
§ 371 (c)(1),
(2) Date: Sep. 24, 2018

(87) PCT Pub. No.: WO2017/163388
PCT Pub. Date: Sep. 28, 2017

(65) Prior Publication Data
US 2020/0303957 A1 Sep. 24, 2020

(51) Int. Cl.
*H02J 50/12* (2016.01)
*H02J 50/80* (2016.01)
(Continued)

(52) U.S. Cl.
CPC .............. *H02J 50/12* (2016.02); *H02J 50/40* (2016.02); *H02J 50/80* (2016.02); *H02J 50/90* (2016.02);
(Continued)

(58) Field of Classification Search
CPC .. H02J 50/12; H02J 50/80; H02J 50/90; H02J 50/40
See application file for complete search history.

(56) References Cited

U.S. PATENT DOCUMENTS

| 2013/0062966 A1 | 3/2013 | Verghese et al. |
| 2014/0174870 A1* | 6/2014 | Niizuma .............. H02J 50/12 191/10 |

(Continued)

FOREIGN PATENT DOCUMENTS

| EP | 1 677 588 A2 | 7/2006 |
| EP | 3 417 991 A1 | 12/2018 |

(Continued)

OTHER PUBLICATIONS

International Search Report dated May 24, 2016 in PCT/JP2016/059529 filed Mar. 25, 2016.

*Primary Examiner* — John W Poos
(74) *Attorney, Agent, or Firm* — Oblon, McClelland, Maier & Neustadt, L.L.P.

(57) ABSTRACT

A contactless electric power supply device configured to widen a range in which power supply is possible to a moving body in a connection direction by supplying electric power from a supply coil to the moving body provided with the receiving coil in a contactless manner and connecting power supply modules provided with the supply coil, wherein, when at least one of the receiving coils is positioned to be able to receiver power from at least one of the supply coils, the contactless electric power supply device performs communication from the power supply module to an alternating module that supplies alternating current and performs communication from the alternating module to the power supply module, and causes a semiconductor switch provided on the power supply module to conduct electricity.

3 Claims, 2 Drawing Sheets

(51) Int. Cl.
  *H02J 50/90*   (2016.01)
  *H02J 50/40*   (2016.01)
  *H05K 13/00*   (2006.01)
  *H05K 13/02*   (2006.01)
(52) U.S. Cl.
  CPC ......... *H05K 13/0061* (2013.01); *H05K 13/02* (2013.01)

(56) References Cited

U.S. PATENT DOCUMENTS

| | | | |
|---|---|---|---|
| 2015/0115726 A1* | 4/2015 | Kang | H02J 7/025 |
| | | | 307/104 |
| 2016/0068070 A1 | 3/2016 | Huang et al. | |
| 2019/0044387 A1* | 2/2019 | Takikawa | H02J 50/12 |

FOREIGN PATENT DOCUMENTS

| | | |
|---|---|---|
| EP | 3 419 403 A1 | 12/2018 |
| JP | 7-322535 A | 12/1995 |
| JP | 2009-284695 A | 12/2009 |
| JP | 2010-47210 A | 3/2010 |
| JP | 2010-283257 A | 12/2010 |
| JP | 2011-167031 A1 | 8/2011 |
| JP | 2012-75304 A | 4/2012 |
| JP | 2013-51744 A | 3/2013 |
| JP | 2015-19484 A | 1/2015 |
| JP | 2015-104164 A | 6/2015 |
| WO | WO2014/010083 A1 | 1/2014 |

\* cited by examiner

CONTACTLESS ELECTRIC POWER SUPPLY DEVICE

TECHNICAL FIELD

The present application relates to a contactless electric power supply device that supplies electric power to a moving body from a fixed section in a contactless manner.

BACKGROUND ART

Patent literature 1 discloses an example of technology for reliably supplying electric power to one of two receiver coils while detecting a position with a sensor when using two supply coils and two receiver coils.

Patent literature 2 discloses an electric power supply device that charges a battery of a moving body from a primary coil on the ground via a secondary coil using electromagnetic induction.

Background art such as that given above is known.

CITATION LIST

Patent Literature

Patent literature 1: JP-A-H7-322535
Patent literature 2: JP-A-2009-284695

BRIEF SUMMARY

Technical Problem

However, in the above patent literature, it is not disclosed how to handle cases when the moving distance of the receiving coil changes or when the quantity of lined up supply coils increases or decreases.

The present disclosure takes account of and solves such problems by providing a device that enables connecting of supply coils and control thereof when the moving distance of the receiving coil changes or when the quantity of lined up supply coils increases or decreases.

Solution to Problem

A contactless electric power supply device of the present disclosure that solves the above problems is configured to widen a range in which power supply is possible to a moving body in a connection direction by supplying electric power from a supply coil to the moving body provided with the receiving coil in a contactless manner and connecting power supply modules provided with the supply coil, wherein, when at least one of the receiving coils is positioned to be able to receiver power from at least one of the supply coils, the contactless electric power supply device performs communication from the power supply module to an alternating module that supplies alternating current and performs communication from the alternating module to the power supply module, and causes a semiconductor switch provided on the power supply module to conduct electricity.

Advantageous Effects

In the contactless electric power supply device of the present disclosure, it is possible to perform stable contactless electric power supply even if the moving distance of the receiving coil changes or the quantity of lined up supply coils is increased or decreased.

DESCRIPTION OF EMBODIMENTS

Figure 1:
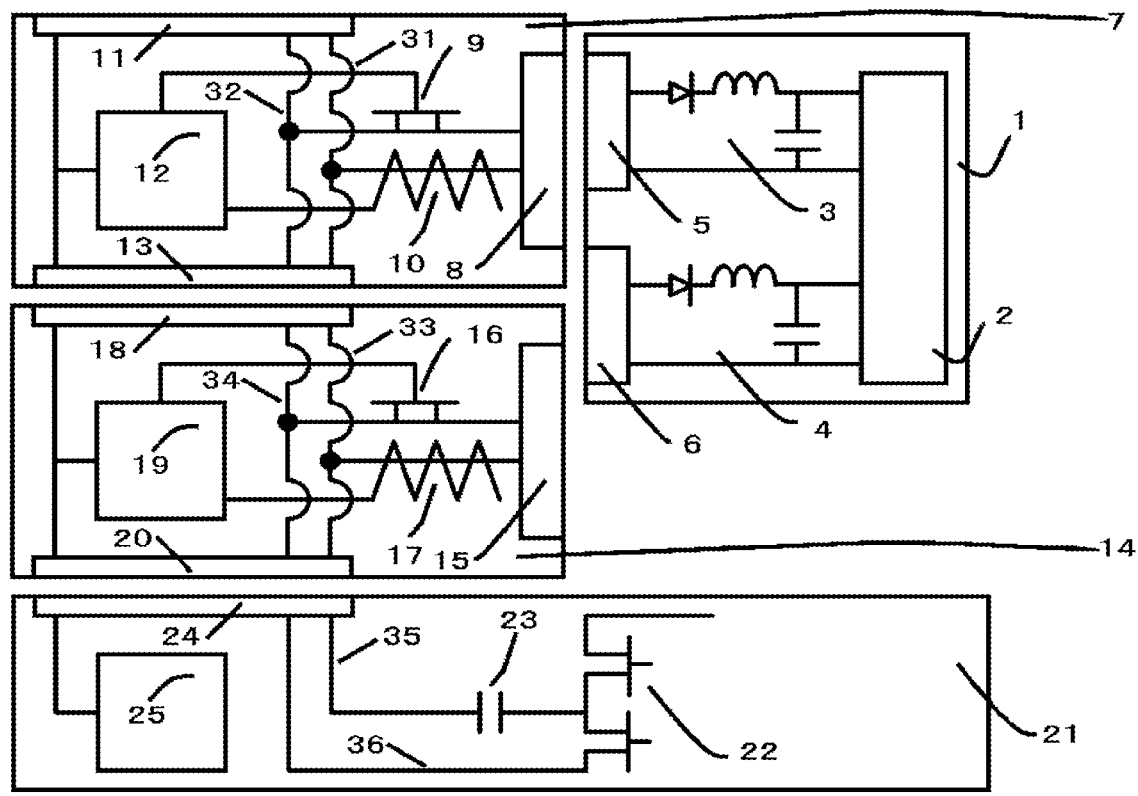
FIG. 1 schematically illustrates the configuration of an embodiment of the contactless electric power supply device.

A contactless electric power supply device that is an embodiment of the present disclosure is described below with reference to FIG. 1. FIG. 1 schematically illustrates the configuration of a contactless electric power supply device of an embodiment. The contactless electric power supply device of the embodiment is applied to a board production line. As shown in FIG. 1, the contactless electric power supply device is configured from two machines, first and second board production machines 7 and 14. The up-down direction in FIG. 1 is an arrangement direction of first and second board production machines 7 and 14, and is also a movement direction of moving body 1, which is described later.

Board production machines 7 and 14 are modularized such that the width dimension in the arrangement direction of each module is the same. First and second board production machines 7 and 14 are configured such that the arrangement positions of the machines can be changed and the machines can be exchanged with other modularized board production machines. The quantity of board production machines that configures the board production line may be two or more, and it is possible to increase the arrangement quantity by increasing the quantity of modules later. A component mounter is an example of first and second board production machines 7 and 14, but they are not limited to this.

A guide rail, which is not shown, that extends in the arrangement direction is provided on a side of first and second board production machines 7 and 14 that faces moving body 1. Moving body 1 moves in the movement direction (the arrangement direction of first and second board production machines 7 and 14) along the guide rail. Moving body 1 conveys units or materials used at board production machines 91, 92, and 93 from a storage unit, which is not shown, and returns the units or materials to the storage unit after use.

The contactless electric power supply device of the embodiment is for performing contactless electric power supply to moving body 1 from first and second board production machines 7 and 14. The contactless electric power supply device is configured from items such as: alternating current power source 22 and supply coils 8 and 15 provided respectively on alternating module 21 and first and second board production machines 7 and 14, and receiving coils 5 and 6 provided on moving body 1.

Alternating current power supply 22 provided on alternating module 21 generates alternating current voltage and supplies it to supply coils 8 and 15. It is desirable to set the frequency of the alternating current voltage based on the resonance frequency of the receiving side resonance circuit and the supply side resonance circuit. The total of two supply coils, 8 and 15, provided on board production machines 7 and 14 can operate independently from each other. Alternating module 21 is also provided with resonance capacitor 23, conducting wires 35 and 36, calculation processing unit 25, and connector 24. Resonance capacitor 23 is a resonance element that forms a supply side resonance circuit connected in series to supply coils 8 and 15. Calculation processing unit 25 is able to communicate with calculating processing units 12 and 19 provided respectively on first and second board production machines 7 and 14.

Alternating current power source 22, for example, may be configured using a direct current power source section that outputs direct current voltage, and a well-known bridge circuit that converts direct current voltage into alternating current. Alternating current power source 22 may be equipped with functions for adjusting a voltage value, a frequency, a phase, or the like. Alternating current power source 22 is connected to connector 24 via conducting wires 35 and 36. Also, connector 24 of alternating module 21 is connected to connector 20 of second board production machine 14. Further, connector 20 is connected to connector 18 via conducting wires 33 and 34. Connectors 11 and 13 of first board production machine 7 are similarly connected via conducting wires 31 and 32. When a new board production machine is added, connector 11 is connected to the connector of the new machine.

As shown in FIG. 1, first and second board production machines 7 and 14 are provided with connectors 11, 13, 18, and 20, calculation processing units 12 and 19, conducting wires 31, 32, 33, and 34, semiconductor switches 9 and 16, current detecting sections 10 and 17, and supply coils 8 and 15. Supply coils 8 and 15 are an example of an electric power supply element. Supply coils 8 and 15 are respectively provided on a side of board production machines 7 and 14 that faces moving body 1.

Receiving coils 5 and 6 provided on moving body 1 are arranged on a side facing supply coils 8 and 15 of first and second board production machines 7 and 14, and are separated from each other in the movement direction. Receiving coils 5 and 6 and supply coils 8 and 15 electromagnetically couple with each other, generating mutual inductance, such that contactless electric power supply is enabled. Receiving coils 5 and 6 are examples of an electric power receiving element. Receiving coils 5 and 6 are connected to load 2 via rectifier smoothing circuits 3 and 4 respectively. Rectifier smoothing circuits 3 and 4 include a diode and a coil. Further, a capacitor is connected in series to receiving coils 5 and 6, and this is a resonance element that forms the receiving side resonance circuit.

Figure 2:
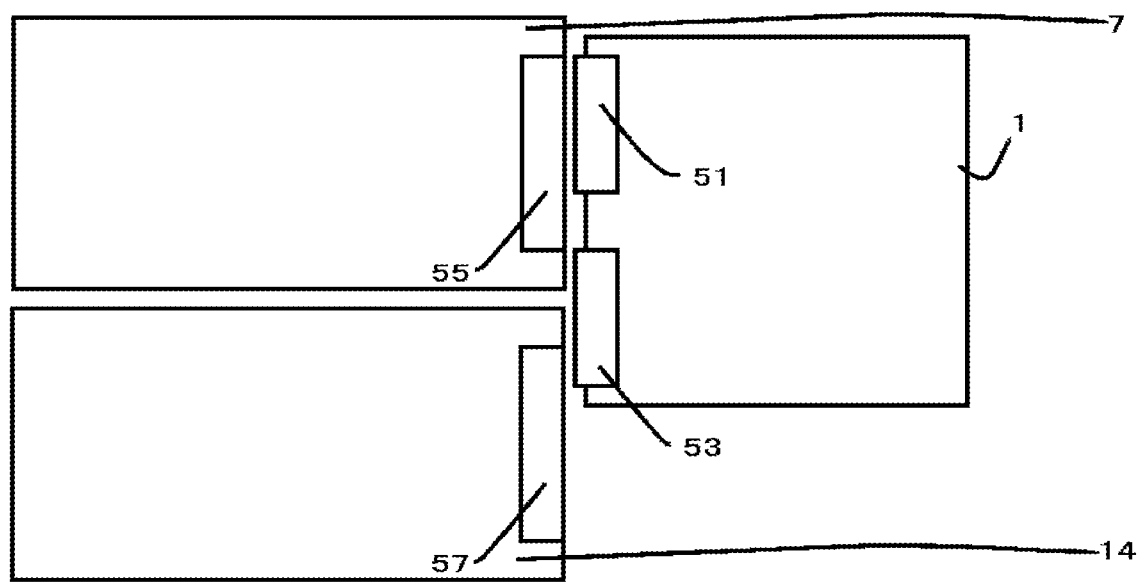
FIG. 2 schematically illustrates an embodiment of the contactless electric power supply device with a configuration different to that of FIG. 1.

FIG. 2 schematically illustrates an embodiment of the contactless electric power supply device with a configuration different to that of FIG. 1. As shown in FIG. 2, first and second board production machines 7 and 14 are provided with detecting sections 55 and 57 corresponding to supply coils 8 and 15. These are for detecting which of receiving coils 5 and 6 provided on moving body 1 is at a position at which power supply is possible. In detail, the detecting sections detect detected sections 51 and 53 that correspond to receiving coils 5 and 6 respectively. This configuration, for example, is provided at a position at which the height of the board production machine is different (a different height in the vertical direction in the figure).

Detailed operation of the contactless electric power supply device of the embodiment is described next. First, detecting section 55 detects that supply coil 8 of first board production machine 7 is at a position at which power supply is possible.

Next, calculation processing unit 12 of first board production machine 7 receives that information from detecting section 55 and sends the information from detecting section 55 to calculation processing unit 25 of alternating module 21 via the communication wire of first board production machine 7, connector 13, the communication wire of second board production machine 14, connector 20, connector 24, and the communication wire of alternating module 21.

Here, calculation processing unit 25 sends information to calculation processing unit 12 of first board production machine 7 via communication wires and the like such that supply coil 8 of first board production machine 7 is capable of supplying power to receiving coil 5. Here, calculation processing unit 25 checks whether there are any errors with the power supply system.

Calculation processing unit 12 receives the information from calculation processing unit 25 and turns on semiconductor switch 9. By doing this, power supply from supply coil 8 to receiving coil 5 is started.

Note that, calculation processing unit 12 is also connected to current detecting section 10 and, for example, when excess current flows in supply coil 8, that is detected, and semiconductor switch 9 can be turned off.

Also, moving body 1 converts alternating current electric power received by receiving coil 5 into direct current via rectifier smoothing circuit 3 and supplies the power to load 2.

With such a contactless electric power supply device, alternating current power source 22 is able to stop supply of alternating current power to a receiving coil separated from moving body 1, thus the loss that is generated is reduced.

Further, the contactless electric power supply device of the embodiment is further provided with a receiving side capacitor and a supply side capacitor that form a resonance circuit (resonance element) connected to receiving coils and supply coils. Accordingly, it is possible to use the resonance characteristics to achieve highly efficient power supply.

Further, a power receiving element is configured from the receiving coil and a power supply element is configured from the supply coil. Accordingly, it is possible to always achieve stable power supply in a contactless manner using the contactless electric power supply that uses electromagnetic coupling.

Also, the fixed section is the board production line in which multiple board production machines are arranged in a line, the moving direction is set in a direction in which the multiple board production machines are lined up, and the multiple supply coils are arranged in a quantity that is the same as the quantity of the multiple board production machines. Accordingly, in all cases of adding modules to the line such that the arrangement quantity is at least three, via changes to the arrangement order of the board production machines, or replacing machines with other modular board production machines, the contactless electric power supply device maintains a favorable receiving state. Thus, in cases in which the configuration of the board production line is changed or when modules are added, it is easy to perform changeover work related to the contactless electric power supply device.

Figure 3:
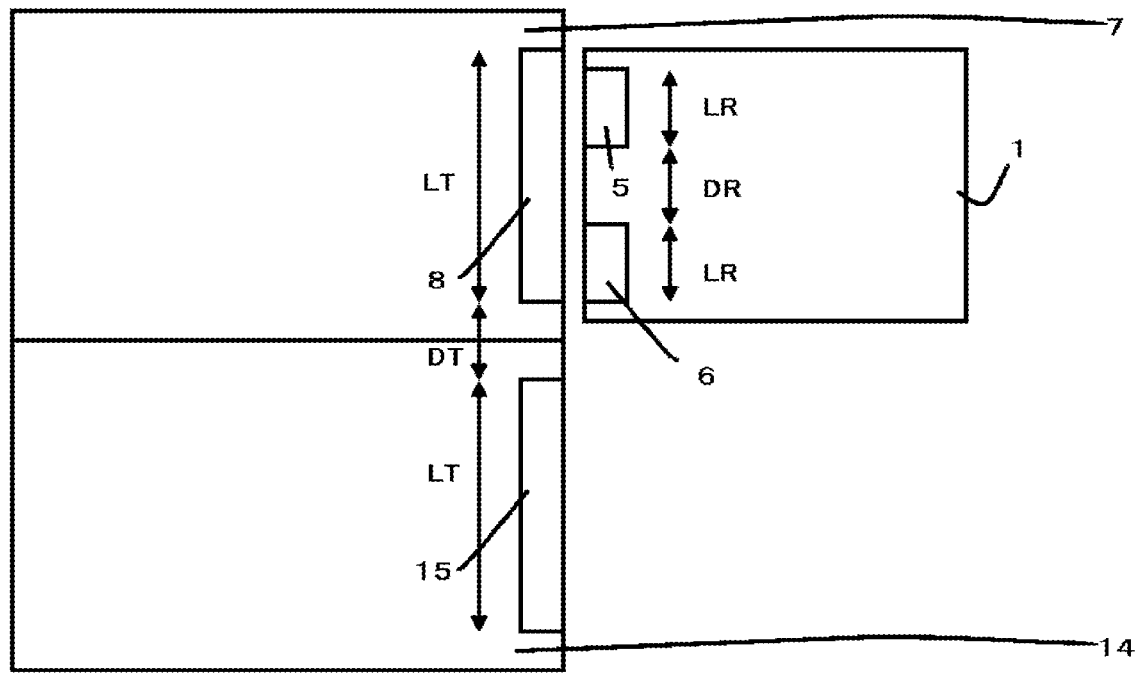
FIG. 3 illustrates an alternative example.

Next, an alternative embodiment is described with reference to FIG. 3. The length of supply coils 8 and 15 on the board machine side in the movement direction is given as LT, and the separation distance between supply coils 8 and 15 is given as DT. Further, the length of receiving coils 5 and 6 on the moving body 1 side in the movement direction is given as LR, and the separation distance between receiving coils 5 and 6 is given as DR. The length of supply coils 8 and 15 in the movement direction is slightly smaller than the width dimension of board production machine 7 and 14.

In this case, when LR≤DT≤DR, and (2×LR+DR)≤LT, it is possible to perform power supply as moving body 1 moves without needing to equip moving body 1 with a battery or the like. In FIG. 3, an example is shown in which LR=DT=DR, and (2×LR+DR)≤LT. This is because, even if moving body 1 moves, at least one receiving coil is facing a supply coil.

According to this configuration, at least one receiving coil directly faces a supply coil at all times regardless of the position of moving body 1. Thus, it is possible for at least one receiving coil to maintain a favorable power receiving state such that a large alternating current can be received. By this, it is possible to curtail uneven alternating current that is received and to always achieve stable contactless power supply.

Further, in the contactless electric power supply device of the alternative embodiment, there is a positional relationship in which one receiving coil of the multiple receiving coils directly faces one supply coil of multiple supply coils and another receiving coil of the multiple receiving coils directly faces another one of the multiple supply coils. At this time, the two receiving coils are both in a favorable power receiving state, so a large alternating current is maintained.

Also, with the contactless electric power supply device of the alternative embodiment, there is a positional relationship in which two adjacent receiving coils 5 and 6 are directly facing one supply coil in accordance with the movement of moving body 1. At this time, the two receiving coils 5 and 6 are in a favorable power receiving state in which the magnetic flux induced by a single supply coil is shared, so a large alternating current is maintained.

Further, receiving coils 5 and 6 include multiple rectifier smoothing circuits 3 and 4 that convert received alternating current to direct current drive voltage and output the direct current, with the output side of each rectifier smoothing circuit 3 and 4 being lined up and connected with respect to load 2. According to this circuit configuration, it is possible to drive load 2 with alternating current power received by at least one receiving coil in a favorable power receiving state. Accordingly, a power storing element (battery) and a charging circuit are not required.

Figure 4:
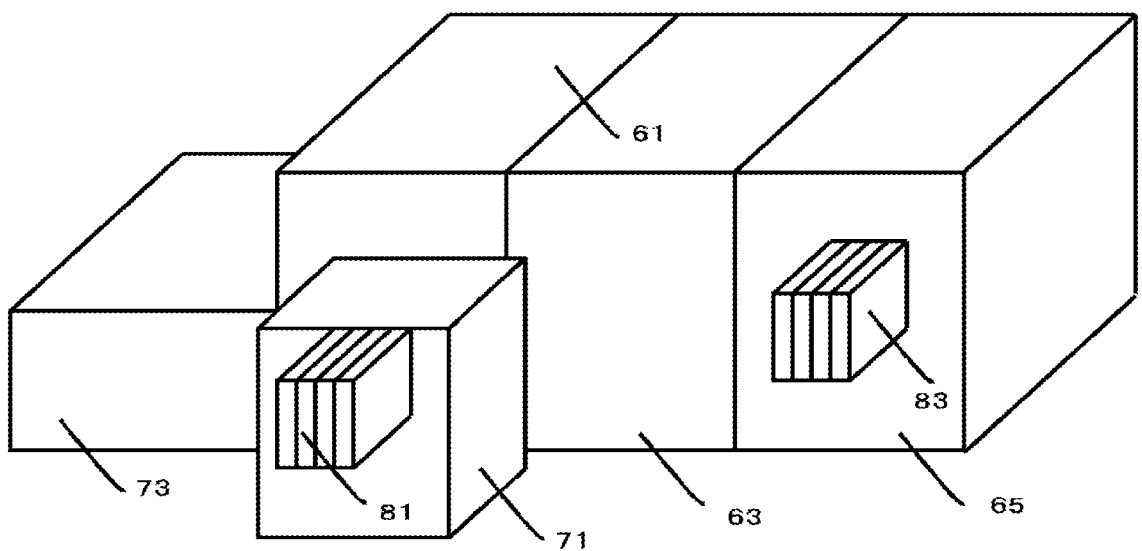
FIG. 4 shows an example of a board production line.

FIG. 4 shows an example in which the contactless electric power supply device of the present disclosure is applied to a board production line. In this line, first to third board production machines 61, 63, and 65 are lined up together with alternating module 73. Moving body 71 moves along the arrangement direction of first to third board production machines 61, 63, and 65. Moving body 71 conveys component supply device 81 that is used at each board production machine 61, 63, and 65 and, for example, performs the task of exchanging component supply device 83 that is held by board production machine 65. At this time, electric power supplied by contactless electric power supply device can be used to move moving body 71 or to exchange component supply devices.

The type of contactless power supply of the present disclosure is not limited to electromagnetic induction or electromagnetic resonance, for example, it may be an electrostatic coupling method that uses supply electrodes and receiving electrodes. Various other applications and modifications are possible for the present disclosure.

The contactless electric power supply module of the present disclosure may be standardized and loaded with only one supply coil. When such a power supply power configures a modular connecting type manufacturing device as a single module, it is easy to change, add, or remove modules, thereby achieving a flexible manufacturing device with a configuration that is easy to change. Here, this standardization refers to substantially the same module width, such that it is easy to satisfy the conditions LR≤DT≤DR and (2×LR+DR)≤LT. Also, here a manufacturing device refers to general devices that manufacture and includes machine tools, board production lines, and the like.

INDUSTRIAL APPLICABILITY

In addition to the board production line described in the embodiments, the contactless electric power supply device of the present disclosure may be applied to a wide range of fields, such as assembly lines or processing lines for producing other products, and for supplying electric power to electric vehicles that are moving.

REFERENCE SIGNS LIST

1: moving body; 2: load; 3: rectifier smoothing circuit;
4: rectifier smoothing circuit; 5: power receiving coil; 6: power receiving coil;
7: first board production machine; 8: power supply coil; 9: semiconductor switch;
10: current detecting section;
11: connector; 12: calculation processing unit; 13: connector;
14: second board production machine; 15: supply coil; 16: semiconductor switch;
17: current detecting section; 18: connector; 19: calculation processing unit;
20: connector; 21: alternating module; 22: alternating current power source;
23: resonance capacitor; 24: connector; 25: calculation processing unit;
31: conducting wire; 32: conducting wire; 33: conducting wire; 34: conducting wire; 35: conducting wire; 36: conducting wire;
51: detected section; 53: detected section; 55: detecting section; 57: detecting section;
61: first board production machine; 63: second board production machine; 65: third board production machine;
71: moving body; 73: alternating module;
81: component supply device; 83: component supply device

The invention claimed is:
1. A contactless electric power supply device configured to widen a range of power supplied to a moving body in a connection direction, comprising:
 a supply coil that includes a power supply module that supplies electric power;
 a receiving coil of the moving the body configured to receive the electric power from the supply coil in a contactless manner;
 a current detection section of the power supply module that detects a current of the supply coil; and
 a calculation processing unit of the power supply module configured to
  perform communication between the power supply module and an alternating module that supplies alternating current,
  cause a semiconductor switch provided on the power supply module to conduct electricity, when the receiving coil is positioned to receive the power from the supply coil, and shut off the semiconductor switch when the calculation processing unit detects an error in the current detecting section.

2. The contactless electric power supply device of claim 1, provided with the alternating module or the power supply module configured with a conducting wire that transmits alternating current power and a connection terminal provided on an end of the conducting wire.

3. The contactless electric power supply device of claim 1, wherein
the power supply module is standardized and has only one supply coil.

* * * * *